(12) United States Patent
Bobde et al.

(10) Patent No.: US 8,829,640 B2
(45) Date of Patent: Sep. 9, 2014

(54) CONFIGURATION AND METHOD TO GENERATE SADDLE JUNCTION ELECTRIC FIELD IN EDGE TERMINATION

(75) Inventors: Madhur Bobde, San Jose, CA (US);
Lingpeng Guan, Sunnyvale, CA (US);
Anup Bhalla, Santa Clara, CA (US);
Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 479 days.

(21) Appl. No.: 13/065,824

(22) Filed: Mar. 29, 2011

(65) Prior Publication Data

US 2012/0248566 A1    Oct. 4, 2012

(51) Int. Cl.
*H01L 29/02* (2006.01)
*H01L 29/06* (2006.01)

(52) U.S. Cl.
USPC ...... 257/487; 257/341; 257/654; 257/E21.09; 257/E29.005; 438/335; 438/337; 438/369; 438/372

(58) Field of Classification Search
CPC ................. H01L 29/0615; H01L 29/0634
USPC ............ 257/341, 487, 493, 653, 654, E21.09, 257/E29.005; 438/217, 335, 337, 369, 372, 438/527
See application file for complete search history.

(56) References Cited

U.S. PATENT DOCUMENTS

| 8,106,453 | B2 | 1/2012 | Miyajima | |
|---|---|---|---|---|
| 2002/0088990 | A1* | 7/2002 | Iwamoto et al. | 257/136 |
| 2004/0026735 | A1* | 2/2004 | Suzuki et al. | 257/329 |
| 2005/0184336 | A1* | 8/2005 | Takahashi et al. | 257/328 |
| 2006/0261375 | A1* | 11/2006 | Wahl et al. | 257/213 |
| 2007/0290267 | A1* | 12/2007 | Yoshikawa et al. | 257/365 |
| 2009/0079002 | A1* | 3/2009 | Lee et al. | 257/355 |
| 2010/0038712 | A1* | 2/2010 | Watanabe et al. | 257/341 |
| 2010/0163972 | A1* | 7/2010 | Saggio et al. | 257/328 |
| 2011/0057256 | A1 | 3/2011 | Sasaki | |
| 2012/0126328 | A1* | 5/2012 | Lin | 257/368 |

* cited by examiner

*Primary Examiner* — Jose R Diaz
(74) *Attorney, Agent, or Firm* — Bo-In Lin

(57) ABSTRACT

This invention discloses a semiconductor power device disposed in a semiconductor substrate and having an active cell area and an edge termination area the edge termination area wherein the edge termination area comprises a superjunction structure having doped semiconductor columns of alternating conductivity types with a charge imbalance between the doped semiconductor columns to generate a saddle junction electric field in the edge termination.

18 Claims, 17 Drawing Sheets

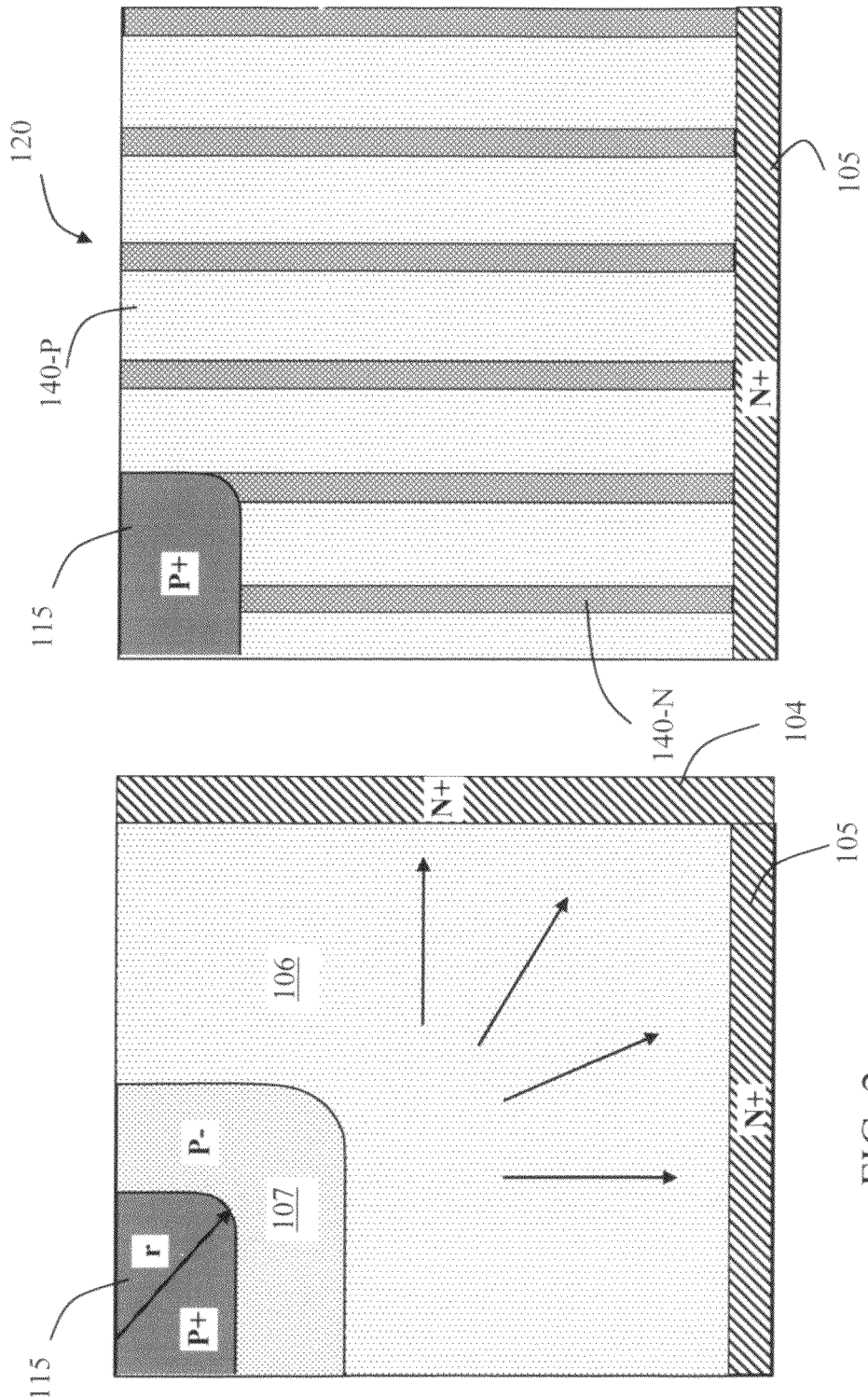

CONFIGURATION AND METHOD TO GENERATE SADDLE JUNCTION ELECTRIC FIELD IN EDGE TERMINATION

BACKGROUND OF THE INVENTION

1. Field of the Invention

The invention relates generally to the semiconductor power devices. More particularly, this invention relates to configurations and methods for manufacturing of new and improved edge terminations for semiconductor power devices to generate electrical field as saddle junctions to reduce the areas occupied by the termination areas while maintaining high breakdown voltages.

2. Description of the Prior Art

Conventional manufacturing technologies and device configuration to further increase the breakdown voltage of a semiconductor power device at the terminal areas are still confronted with difficulties that the termination areas occupied large areas. The difficulties are becoming even more severe and limiting when the semiconductor power devices are now manufactured with ever reduced size. A general survey discovers that for integrate circuit (IC) chips of larger size; the edge termination takes up about 20% of the total area. However, as size of the chip becomes smaller and smaller, the percentage of the edge termination gradually increases and may take up to about 50% of the total area in order to maintain a high breakdown voltage. The termination area is a "non-active" area of a transistor because it is not useful for current conduction. Even though large areas taken up by the edge termination leads to wastes of valuable active cell areas, there are still significant difficulties in reducing the edge termination area while maintaining a high breakdown voltage.

FIGS. 1A and 1B are cross sectional view of an ideal PN junction with parallel plane breakdown voltage, and an unterminated PN junction at the edge of a vertical power device to explain the need of improvements for edge termination. FIG. 1A shows an ideal PN junction between a P+ layer and an N− layer on top of an N+ substrate. Due to the doping difference the N− depletion layer 103 is much wider than the P+ depletion layer 101. Ignoring the edge effect the electric field within the depletion region is evenly distributed with parallel plane avalanche breakdown. This is the theoretical limit of Breakdown voltage that can be reached for the given doping levels and thickness of the lightly doped drift region when ignoring the edge effect. However, the actual breakdown voltage of a reversed bias junction can be severely degraded at the edge where the formation of P+ layer by implantation terminates, due to field crowding from the formation of a cylindrical junction, as shown in FIG. 1B. It can be observed that the shape of the depletion region is convex, and that leads to the electric field crowding near the junction.

In order to mitigate this problem, several edge terminations have been proposed, and are widely used in the industry. Some of these include the floating guard rings 90 of FIG. 1C and the Electric Field plate 92 of FIG. 1D. These techniques improve the Breakdown voltage by spreading the depletion region at the surface and thus lowering the electric field. However, these methods typically require large area for implementation, and cause an increase in the die size of the device. In addition, these techniques are prone to surface charges coming from the passivation films and/or the packaging mold compound.

Therefore, a need still exists in the art of power semiconductor device design and manufacture to provide new and improved configurations of the edge termination such that the above discussed problems and limitations can be resolved.

SUMMARY OF THE PRESENT INVENTION

It is therefore an aspect of the present invention to provide a new and improved edge termination configuration to reduce the electrical field crowding effects near the blocking junction at the device edge and provide a compact termination with lower surface electric field that is less sensitive to surface charge. This is achieved with the formation of a concave or saddle junction in the termination area, with the replacement of the N type drift region with a semiconductor region that has a net P type doping concentration.

Specifically, an aspect of this invention is to provide a new and improved edge termination configuration for a semiconductor power device using a super-junction structure with electric charge imbalance between the P-columns and N-columns, specifically the P column charge is higher than the N column charge, to create a net P type doping in the termination region and to generate a saddle junction electric effect to distribute and spread out the potential lines of the electric field thus reducing the electric field crowding and significantly increases the breakdown voltage without requiring large termination area.

It is another aspect of this invention to provide the new and improved edge termination configuration for a semiconductor power device using a super-junction structure with electric charge imbalance between the P-columns and N-columns by increasing the width of the P-columns to create a net P type doping in the termination region and generate a saddle junction electric effect to distribute and spread out the potential lines of the electric field thus reducing the electric field crowing and significantly increases the breakdown voltage without requiring large termination area.

It is another aspect of this invention to provide the new and improved edge termination configuration for a semiconductor power device using a super-junction structure with electric charge imbalance between the P-columns and N-columns by varying the dopant concentration between the top and bottom portions of the P-columns in order to make the termination more tolerant to variation in the column charge, and to generate a saddle junction electric effect to distribute and spread out the potential lines of the electric field thus reducing the electric field crowing and significantly increases the breakdown voltage without requiring large termination area.

It is another aspect of this invention to provide the new and improved edge termination configuration for a semiconductor power device using a super-junction structure with electric charge imbalance between the P-columns and N-columns by starting the super-junction structure with a P-type epitaxial and having a wide P-type epitaxial gap disposed in the middle of a P column to generate a saddle junction electric effect to distribute and spread out the potential lines of the electric field thus reducing the electric field crowding and significantly increases the breakdown voltage without requiring large termination area.

It is another aspect of this invention to provide the new and improved edge termination configuration for a semiconductor power device using a super-junction structure with electric charge imbalance between the P-columns and N-columns by forming an alternating surface junction termination extension (JTE) on top of the P-columns and N-columns to lower the surface electric field and increase its tolerance to surface charges and to generate a saddle junction electric effect to distribute and spread out the potential lines of the electric field thus reducing the electric field crowing and significantly increases the breakdown voltage without requiring large termination area.

Briefly in a preferred embodiment this invention discloses a semiconductor power device disposed in a semiconductor substrate and having an active cell area and an edge termination area wherein the edge termination area comprises a super-junction structure having doped semiconductor columns of alternating conductivity types with a charge imbalance between the doped semiconductor columns to generate a saddle junction electric field in the edge termination. In a specific embodiment, the doped semiconductor columns comprise P-columns and N-columns and the P-columns having greater electric charges than the N-columns. In another embodiment, the P-columns have greater width than the N-columns. In another embodiment, the P-columns have a higher dopant concentration than the N-columns. In another embodiment, the P-columns have a higher dopant concentration on a top portion than a bottom portion of the P-columns. In another embodiment, the super-junction structure is formed in a P-type epitaxial layer having a wide P-gap disposed in the middle of a P column thus generating a charge imbalance. In another embodiment, the super-junction structure further includes a surface junction termination extension with a doped surface layer extended laterally across on top of the semiconductor columns for generating a charge imbalance in the super-junction structure.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2 is a cross sectional view for explain a saddle junction configuration to generate concave shaped depletion region by using a drift region that has a net doping of a lightly doped P type, that leads to divergent and spreading out of the potential lines of the electric field thus increasing the breakdown voltage in the termination areas of a semiconductor power device.

FIGS. 3 to 6 are a cross sectional views to illustrate the improved edge termination configurations of a semiconductor power device using super-junction structure that has imbalance charges between the P-columns and N-columns to create a saddle junction shaped electrical field thus improves the breakdown voltage of the edge termination.

DETAILED DESCRIPTION OF THE METHOD

Figure 1B:
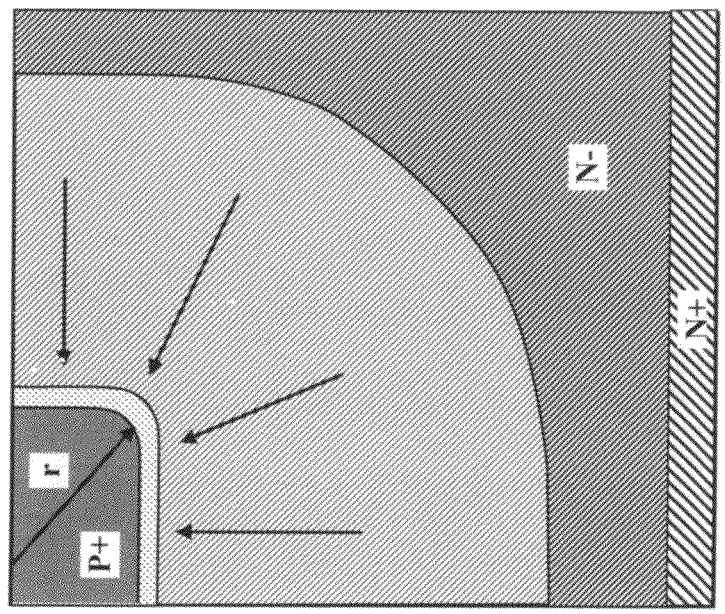
FIG. 1B is a cross sectional view for an un-terminated P-N junction at the device edge that forms a cylindrical junction at the device edge that causes electric field crowding and severe reduction of termination breakdown voltage.
Figure 1A:
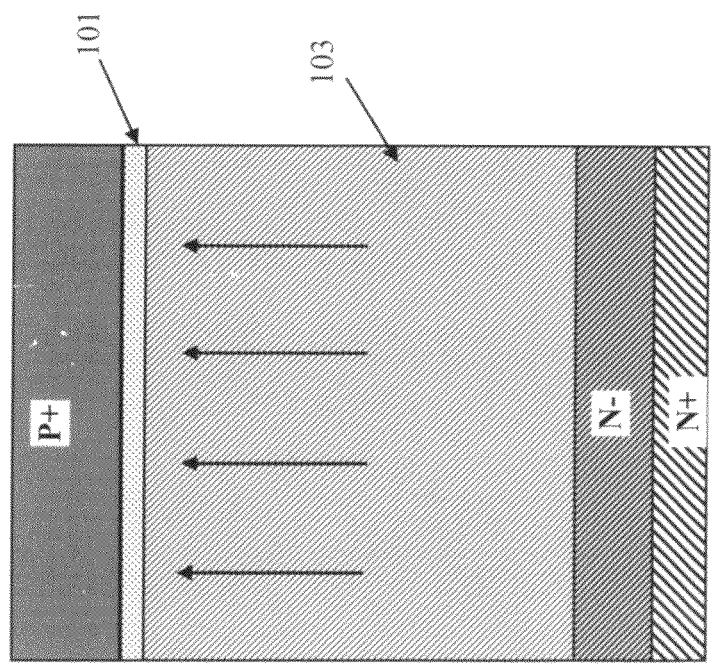
FIG. 1A is a cross sectional view showing an ideal parallel plane junction configuration that achieves the maximum breakdown voltage.
Figure 1C:
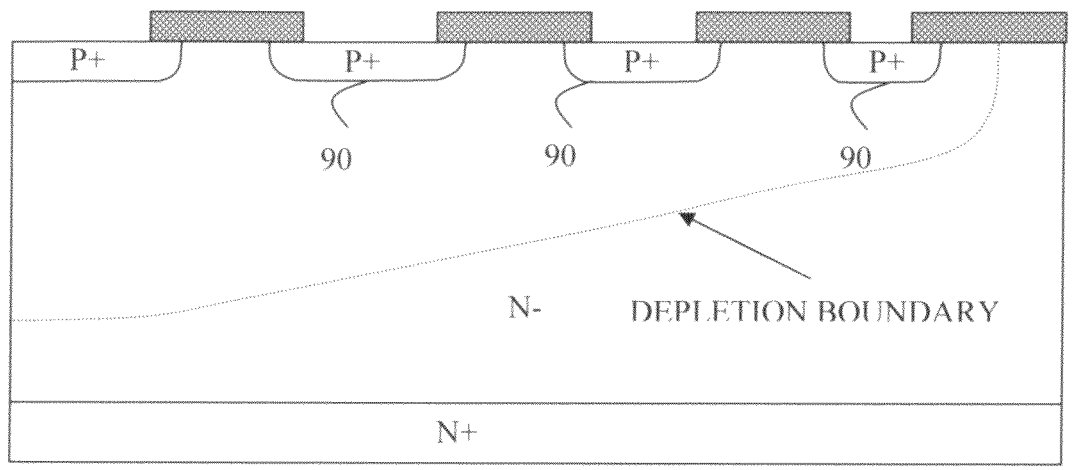
FIG. 1C is a cross section of the edge termination technique using floating field rings, which consists of several islands of P type regions at the device surface.
Figure 1D:
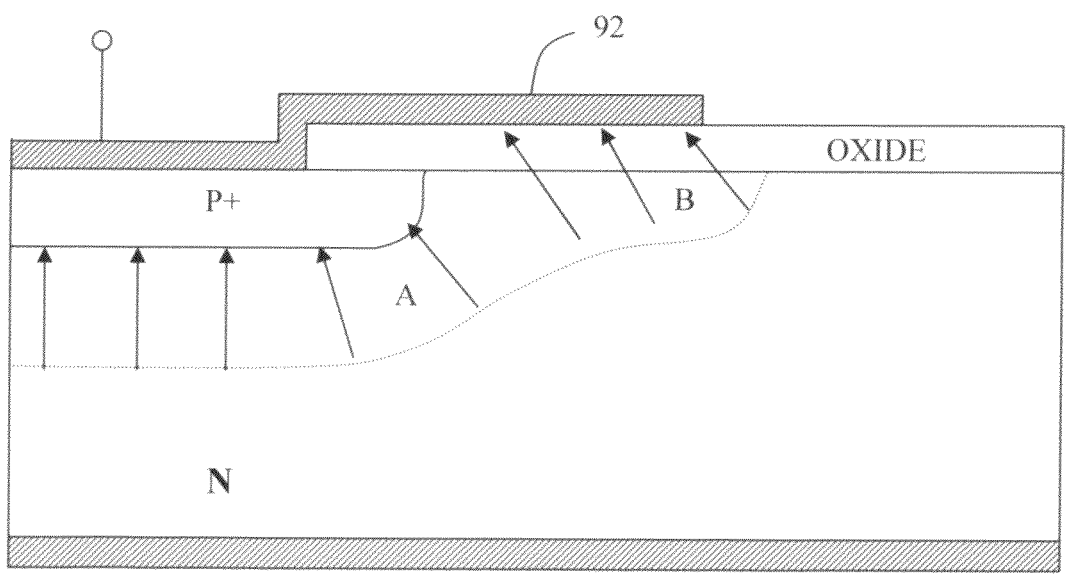
FIG. 1D is a cross section of the edge termination technique using electric field plate, which consists of one or more electrodes tied to source/guard rings for spreading the electric field

For better understanding the invention, FIG. 2 is described as an edge termination configuration with a saddle junction configuration. By definition, a junction is created when a P region diffuse into N type semiconductor region. The saddle junction has the opposite curvature to that of a cylindrical junction, which ameliorates the electric filed crowding and increase the breakdown voltage. Compare to the cylindrical junction shown in FIG. 1B, the lightly doped N type region is replaced with a lightly doped P type region 107 and a junction is formed between the lightly doped P type region 107 and a heavy doped N type edge region 104 and substrate 105 surrounding the lightly doped P type region 107 having a depletion region 106. A heavily doped P+ region 115 is provided for the prevention of reach through breakdown. This saddle junction configuration shifts the peak electric field down to the N+ substrate, and generates a negative charge concave junction that spread out the electric field near the surface. The saddle junction configuration as shown in FIG. 2 significantly reduces the field crowding effects thus improves the breakdown voltage in the termination area. It also make the termination region more compact, because of the absence of any zero field regions that are present in terminations such as floating field rings.

FIG. 3 is a cross sectional view for illustrating an edge termination 120 with a super-junction structure having an electric charge imbalance between the P-columns and N-columns, specifically the P column charge is higher than the N column charge, as an embodiment of this invention. The super-junction structure comprises alternating N and P columns on an N-type semiconductor substrate 105 with a P+ region 115 disposed at a top portion of the edge of a active area of the device (not shown). The super-junction structure includes a plurality of doped columns 140-N and 140-P of alternating N-type and P-type conductivity types respectively. By definition, electric charge is proportional to the doping concentration and the width or the area. For the purpose of creating net P type doping in the termination region, i.e., the P column charge higher the N column charge, either the doping concentration or column width or both can be adjust to create the desired net charge. For a cell pitch of 8 micron, the P-columns 140-P has a wider pitch, e.g., 6 microns, and the N-columns 140-N has a narrower pitch, e.g., 2 microns in the termination area only, while both have the substantial same doping level. The super-junction structure of alternating N-type and P-type conductivity types is terminated with an N-column highly doped enough to form saddle junction. This results in the termination drift region having a net P type doping and generates a saddle junction in the termination edge. As such, a higher breakdown voltage, e.g., breakdown voltage greater than 600 volts, is achieved, and the need for adding conventional termination structures such as the floating guard rings/Field plates and surface junction termination extensions (JTEs) is eliminated. Alternatively the widths of both N-columns and P-columns may be the same and the doping level is adjusted to create a net P charge in the termination area for the purpose of creating a saddle junction.

Figure 4:
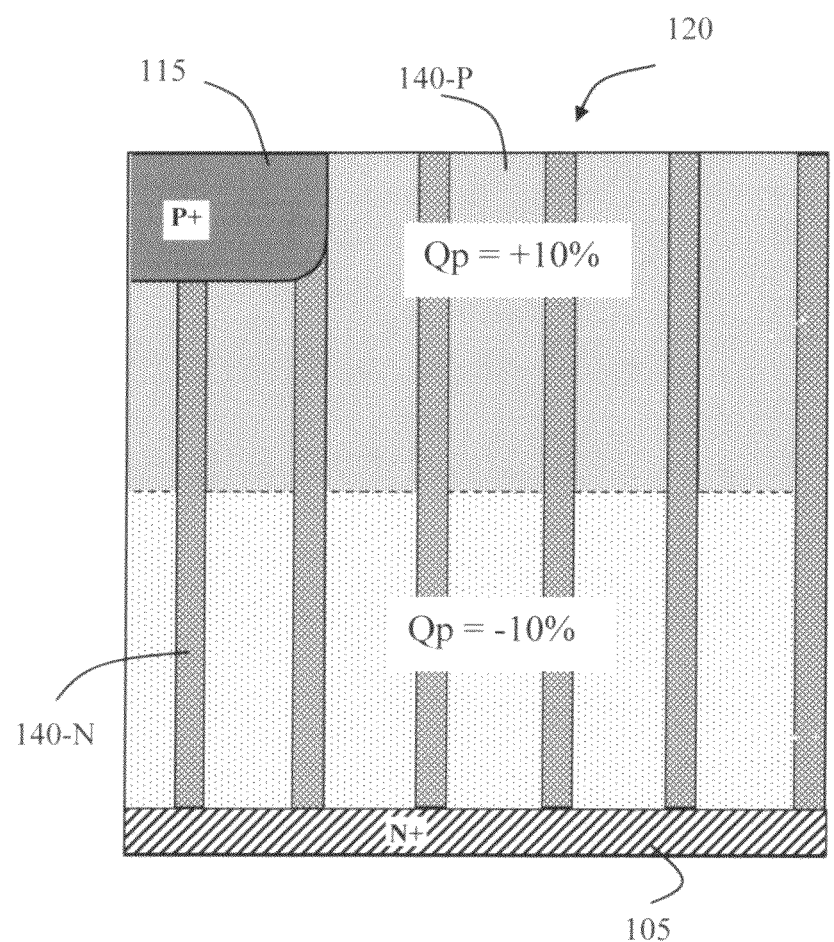

However, higher P column charge affects the vertical breakdown voltage of the device, i.e., there is a tradeoff between vertical breakdown voltage and the termination breakdown voltage. This tradeoff can be optimized by varying the doping concentration in the P column. FIG. 4 is a cross section of another embodiment of this invention with an edge termination that has super-junction structure similar to that of a device shown in FIG. 3 except that the P-columns 140-P have a variable dopant concentration with higher dopant concentration at the top and lower dopant concentration at the bottom. The top half of the P-doped columns 140-P increases 10% dopant concentration, i.e., 10% more than 2.4e12/cm2, and the bottom half of the P-doped columns decreases 10% dopant concentration, i.e., 10% less than 2.4e12/cm2. As such, higher breakdown voltage is achievable than the breakdown voltage of the device shown in FIG. 3 with constant P dopant concentration in the P-doped columns. The variable P-dopant concentration of the P-doped columns 140-P increases the Q-imbalance window of about 11% thus leads to more tolerance to process variations. With the super-junction structure formed at the termination area as shown above, the depletion width of the saddle junction expands to about 60 micron resulting in a compact edge termination compared to the guard rings or filed plate termination. The P-column dopant concentration may be varied with a step profile or a graded profile.

Figure 5:
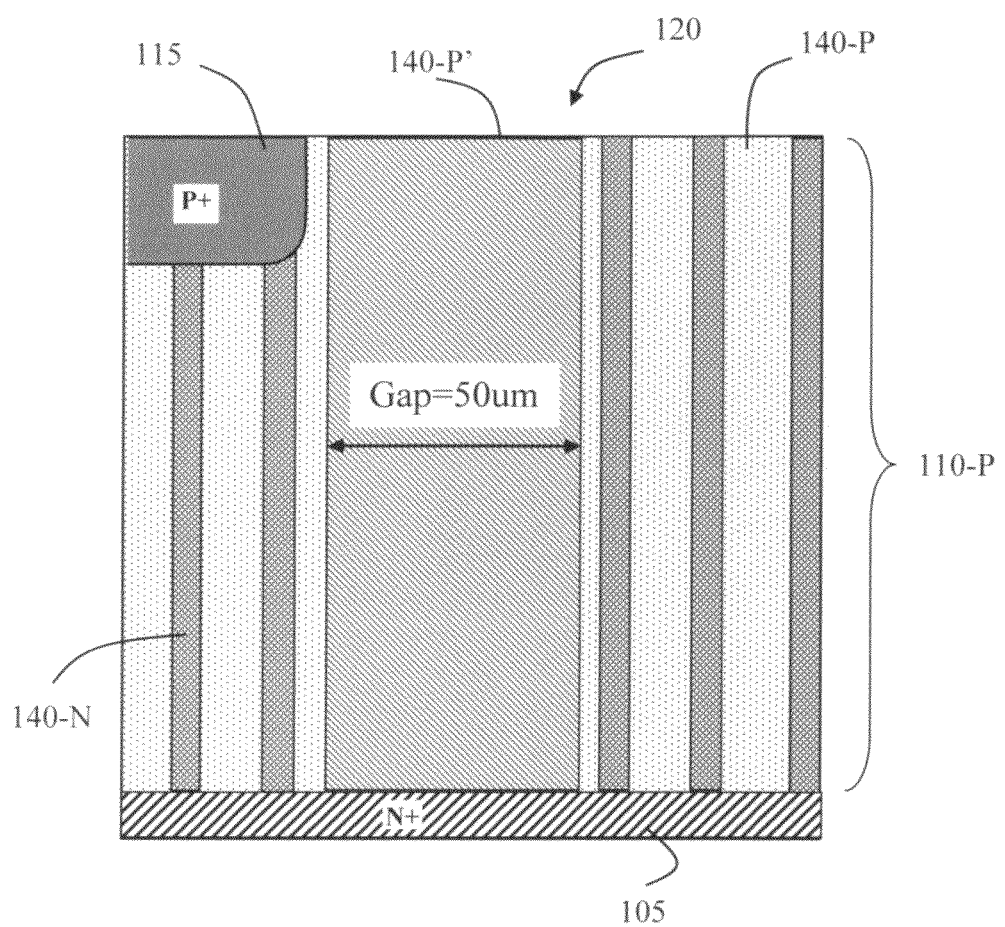

FIG. 5 is a cross sectional view of an alternate embodiment of an improved edge termination of this invention. The edge termination started with a P-type epitaxial layer 110-P. The super-junction structure includes a P-type epitaxial gap 140-P' of about 50 microns disposed in a middle of a P column, and alternating N-columns and P-columns 140-N and 140-P respectively. A charge imbalance window of 40% Q is generated and better breakdown voltage, e.g., breakdown voltage higher than 650 volts, can be achieved. In this embodiment, The P-epitaxial layer 110-P may also be implemented with a P-grading doping profile for UIS design considerations. The doping grading can be achieved by a two or more step epitaxial growth of the P type epitaxial layers, with the P type doping concentration increasing continuously from bottom to top. In this embodiment, the depletion width of the saddle junction expands to 70 micron resulting in a compact edge termination compared to guard rings or field plate termination.

Figure 6:
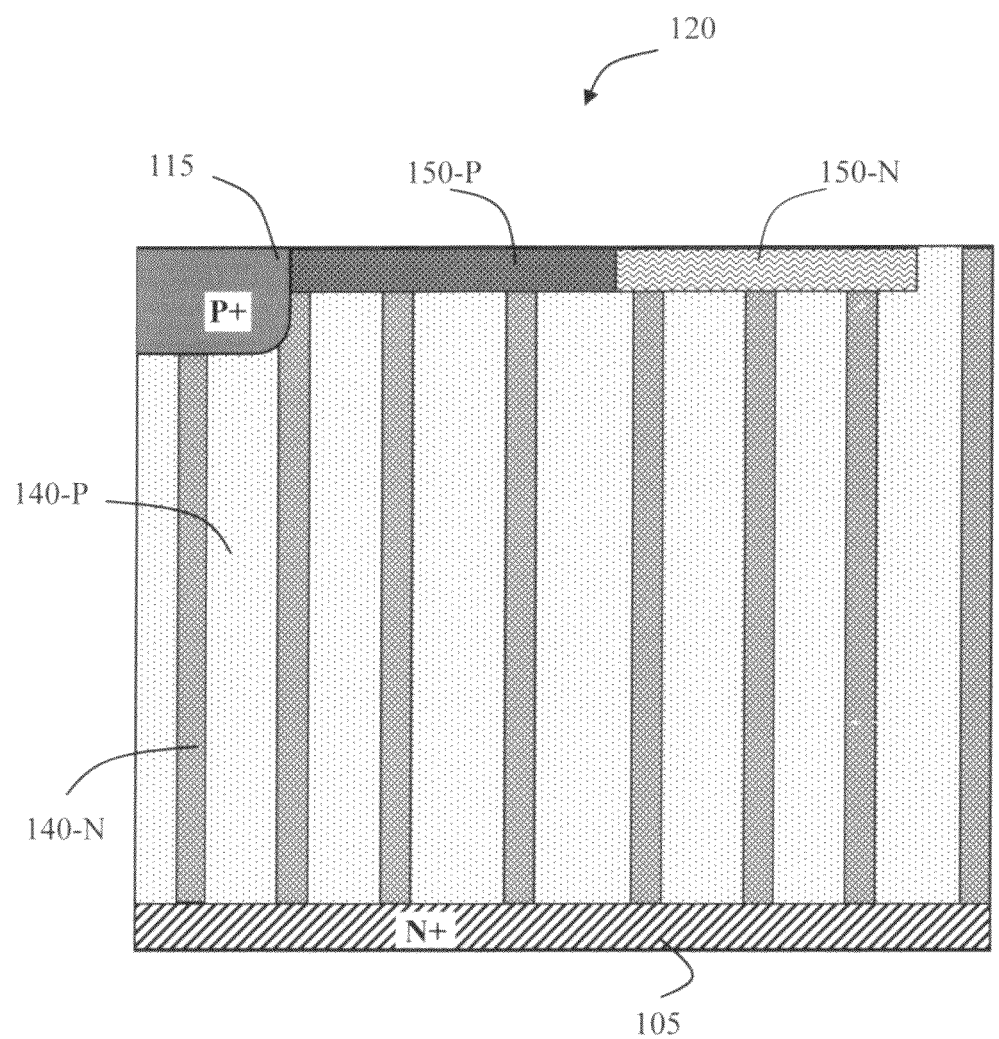

FIG. 6 is cross sectional view of another embodiment of an improved edge termination of a semiconductor power device of this invention. Similar to the edge termination shown in FIG. 3, edge termination has a super-junction structure with doped epitaxial columns 140-N and 140-P with alternating N-type and P-type activities. P-type and N-type surface junction termination extensions (JTE) 150-P and 150-N respectively are formed on top of the doped columns of the super-junction structure. The P-type and N-type JTEs 150-P and 150-N reduce the surface electric field by modifying the electric field shape. They also can be used to make the termination more tolerant to charges in the passivation films and packaging mold compounds. The P-type and N-type JTEs 150-P and 150-N may also be applied to achieve the same effects as an embodiment with varying the column widths, e.g., widening the P-type columns, to achieve an improved breakdown voltage. Alternatively, the P-type and N-type JTEs 150-P and 150-N can be implemented into the super-junction structure with the variable P column doping as shown in FIG. 4 with the JTEs 150-P and 150-N disposed on top of the doped columns of the super-junction structure. In addition, the P-type and N-type JTEs 150-P and 150-N can be implemented into the super-junction structure with the P-type epitaxial gap as shown in FIG. 5 with the type JTEs 150-P and 150-N disposed at a top portion of the gap.

Figure 7A:
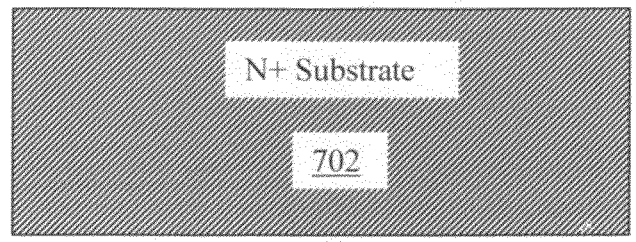
FIGS. 7A-7H are cross sectional views to illustrate a process for manufacturing a super-junction structure of the type depicted in FIG. 3 and FIG. 4.
Figure 7B:
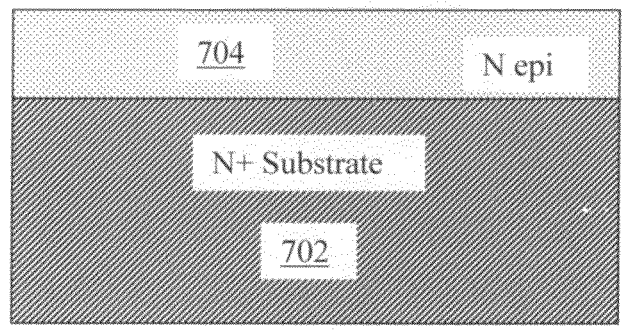
Figure 7C:
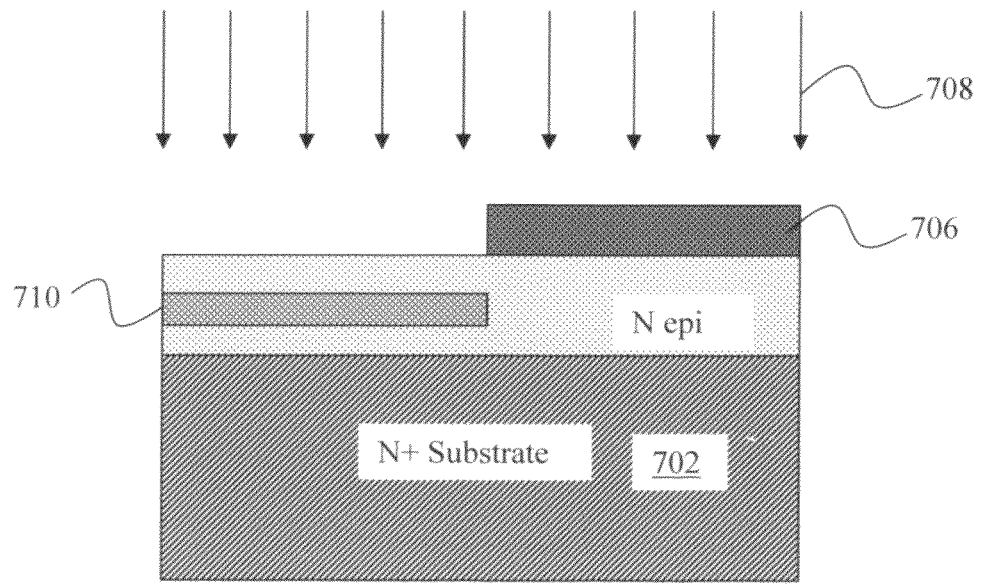
Figure 7D:
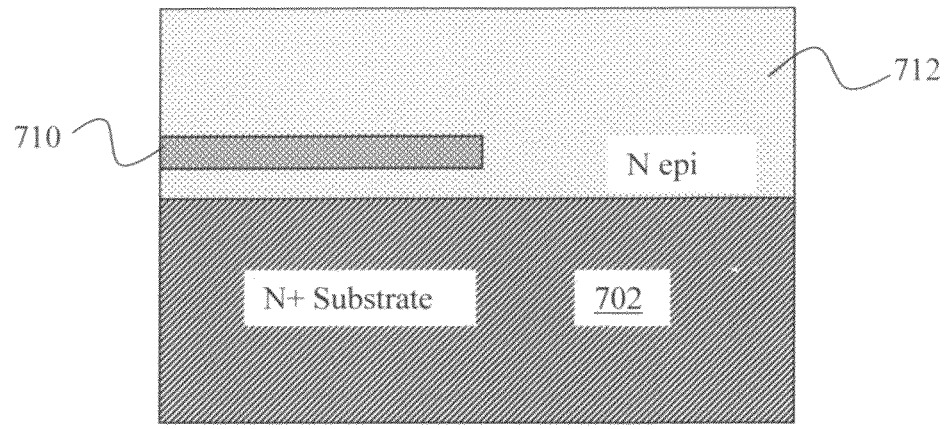
Figure 7E:
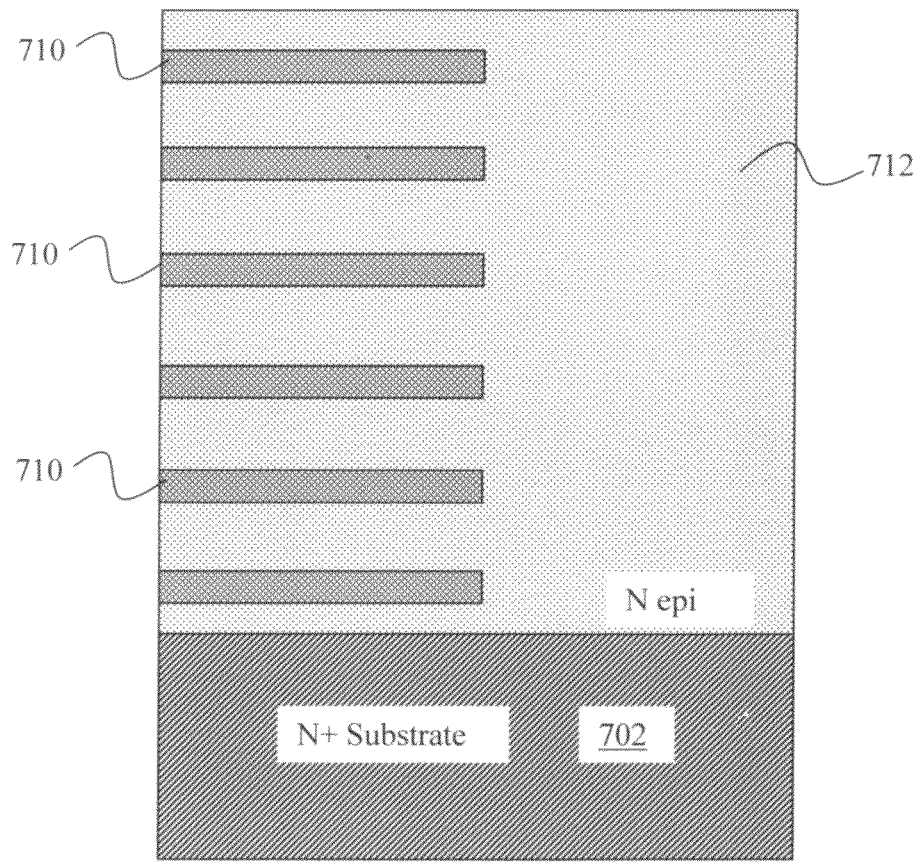
Figure 7F:
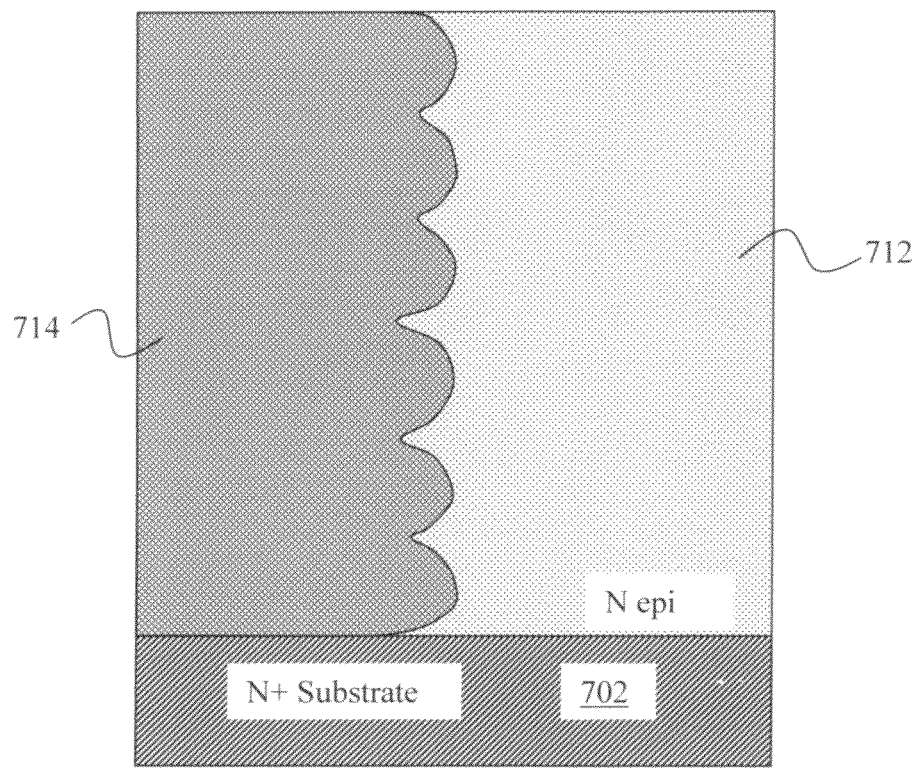

A method for forming a saddle junction edge termination of the type depicted in FIG. 3 and FIG. 4 is shown in FIGS. 7A-7H. The process is started with a heavily doped N type substrate 702 as shown in FIG. 7A. An N type epitaxial layer 704 is grown on the substrate 702 as shown in FIG. 7B. A photoresist mask 706 is deposited on top of the N-epitaxial layer 704 for a deep implantation. Deep implantation of P type dopant 708 is performed at the exposed areas of the N type epitaxial layer to form buried P type layer 710 as shown in FIG. 7C. The photoresist mask 706 is then removed followed by the growing of the N type epitaxial layer 712 as shown in FIG. 7D. The steps of growing N type epitaxial layer and masked implantation showed in FIGS. 7C and 7D are repeated until a predetermined full length of P-columns of a super-junction structure for a saddle junction edge termination is achieved with the buried P type layers being vertically spaced-apart with a predetermined distance that is large enough to form a P type column after the buried P type layers 710 are diffused. By way of an example, six buried P type layers 710 are formed in the N type epitaxial layer 712 as shown in FIG. 7E. The buried P type layers are then thermally diffused and merge to form a full length P-column 714 formed inside the N type epitaxial layer 712 as shown in FIG. 7F, which is only shown a half of a P-column.

Figure 7G:
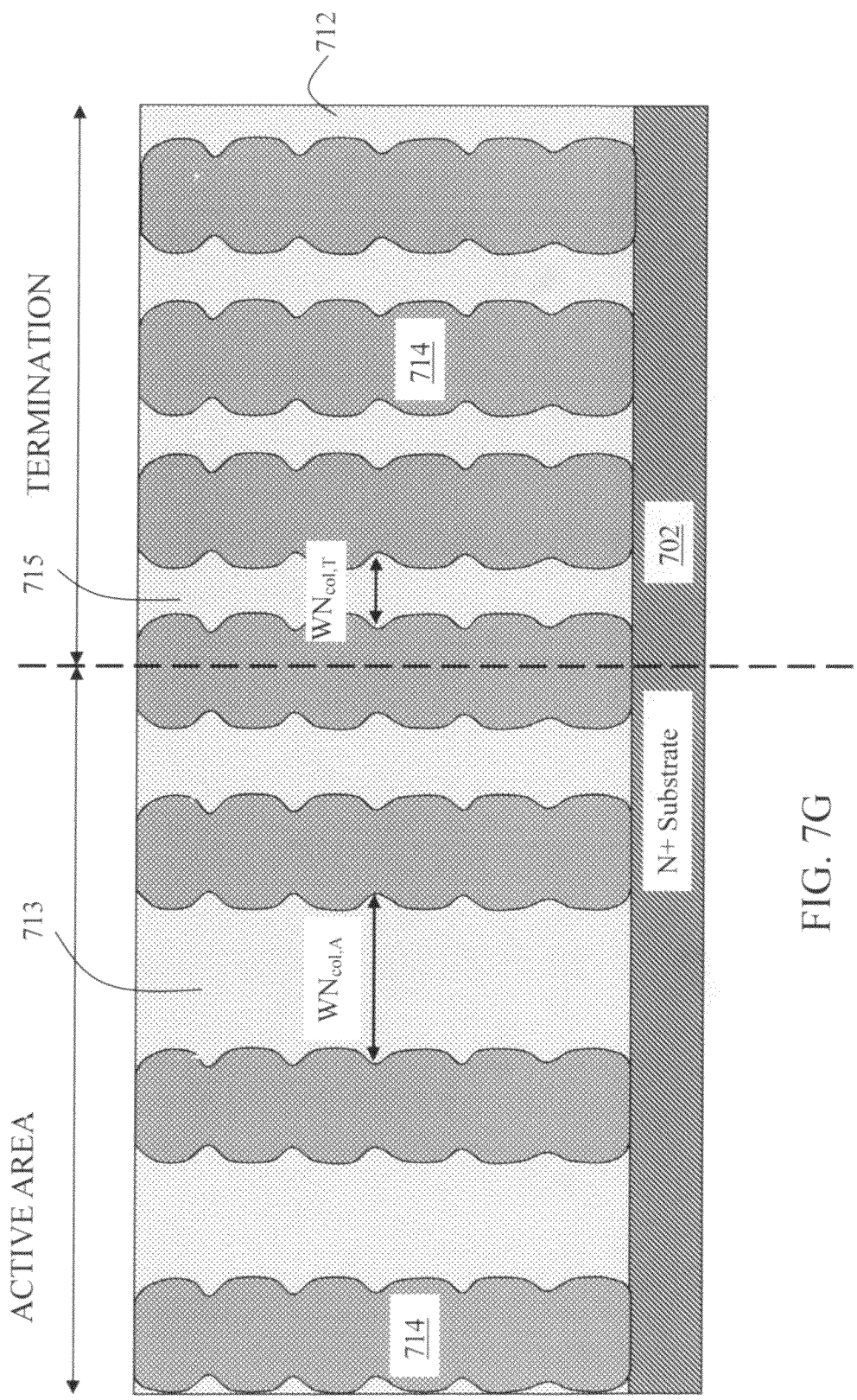
Figure 7H:
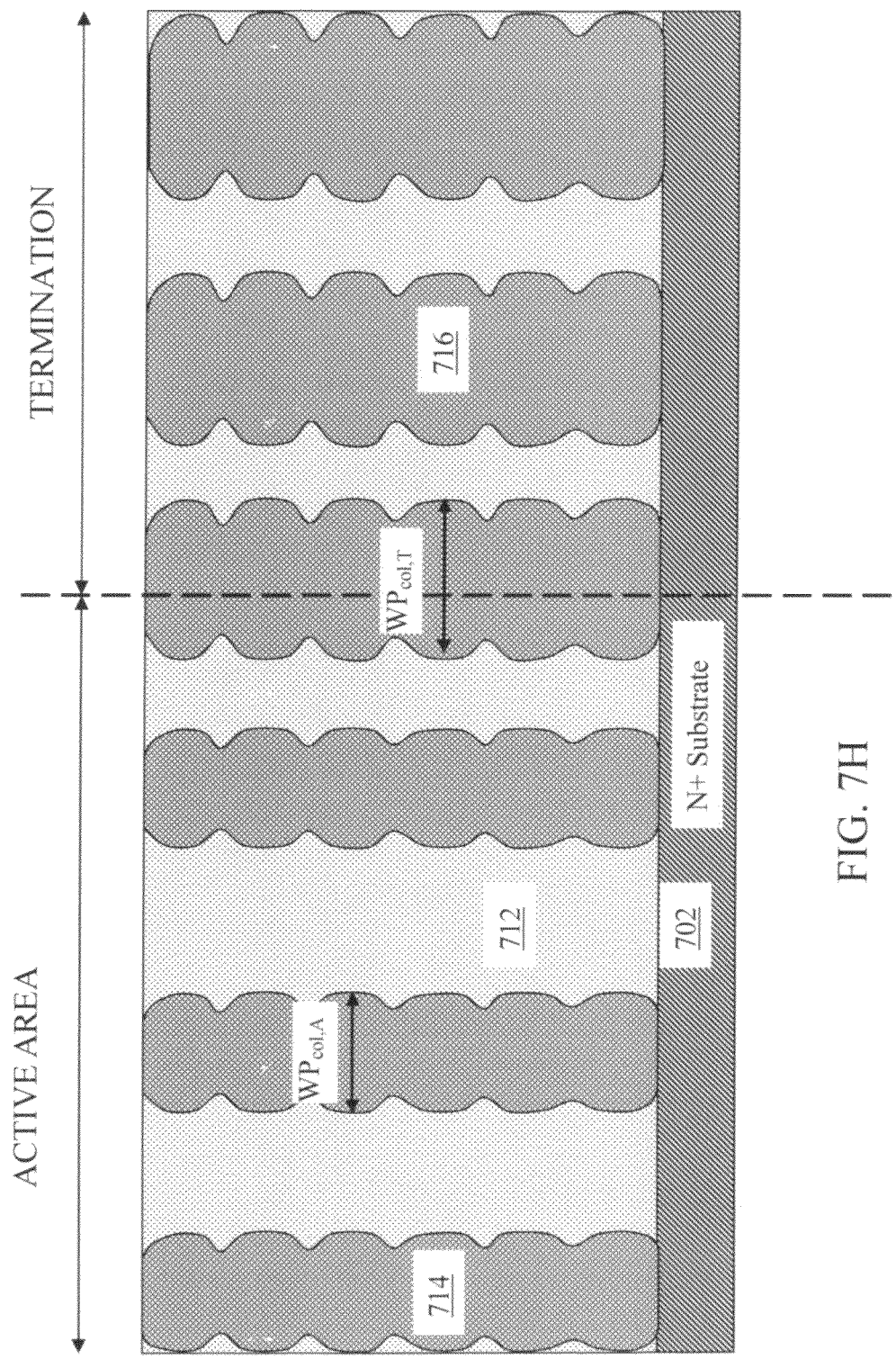

FIG. 7G shows a semiconductor device including a plurality of P-columns 714 formed inside the N type epitaxial layer 712. The P-columns 714 in both active area and termination area are doped with the same doping profile or same doping concentration. The N type epitaxial layer 712 is doped with the same doing profile through out the active and termination areas. The P-columns in active area are doped and spaced such that charges in P-columns are substantially balanced with the N type epitaxial layer between the P-columns. As mentioned above, to achieve net lightly P doped drift region on the termination area, a space between the P-columns at the termination area is reduced, resulting in reduction of the width of a N-column from $WN_{col,A}$ in active area to $WN_{col,T}$ in termination area. As a result, which is shown in FIG. 7H, the width of an N-column 713 in the active area is larger than the width of the N-type column 715 in the termination area. Alternatively, to achieve net lightly P doped drift region on the termination area, the width of the P column can be increased, which can be done by increase the width of the exposed area in the termination area for P-column implant. Alternatively a combination of increasing the P-column width and reducing N-column width in termination area can be adopted to obtain the lightly P doped drift region in termination area. As shown in FIG. 7H, a width of P column 716 in the termination area is larger than a width of the P column 714 in the active area while the width of N-column is reduced at the same time to maintain the same pitch. Further the reach-through prevention P+ doped region 115 as shown in FIG. 3 and FIG. 4 may be formed in a following step separately or preferably at the same time forming P body regions or P+ contact implant regions of superjunction transistor cells (not shown) in the active area. Ideally the P-columns in active area are electrically connected to the P body regions of active transistor while the P-columns in termination area are floating. P-type and N-type surface junction termination extensions (JTE) 150-P and 150-N shown in FIG. 6 may also be formed through masked implantation.

Figure 8A:
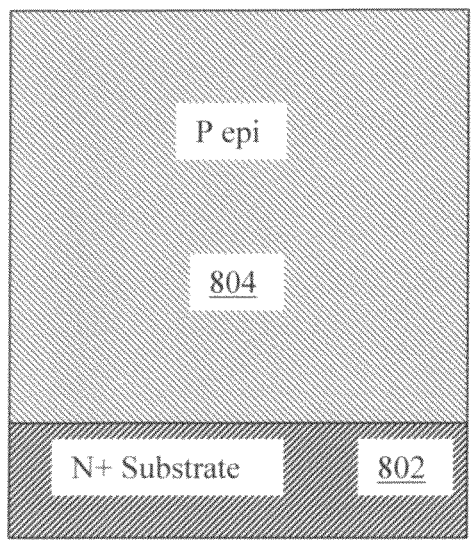
FIGS. 8A-8E are cross sectional views to illustrate a process for manufacturing a super-junction structure of the type depicted in FIG. 5.
Figure 8B:
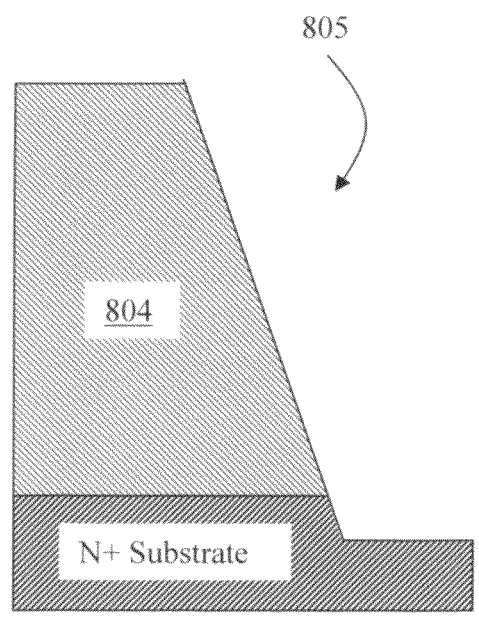
Figure 8C:
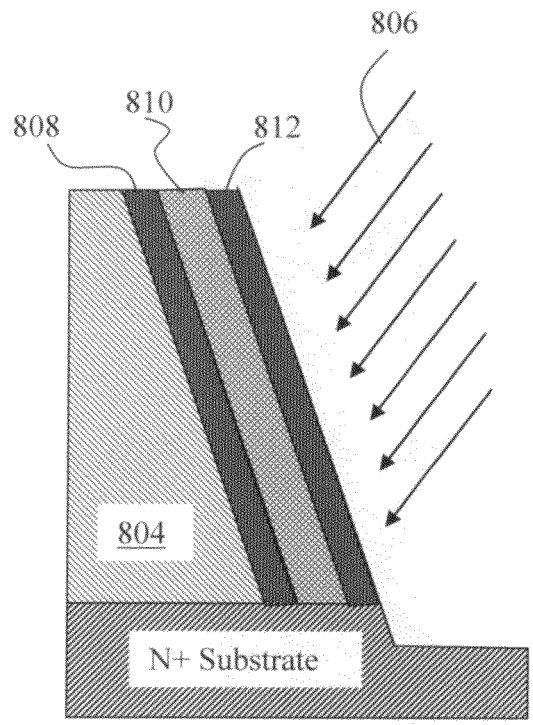
Figure 8D:
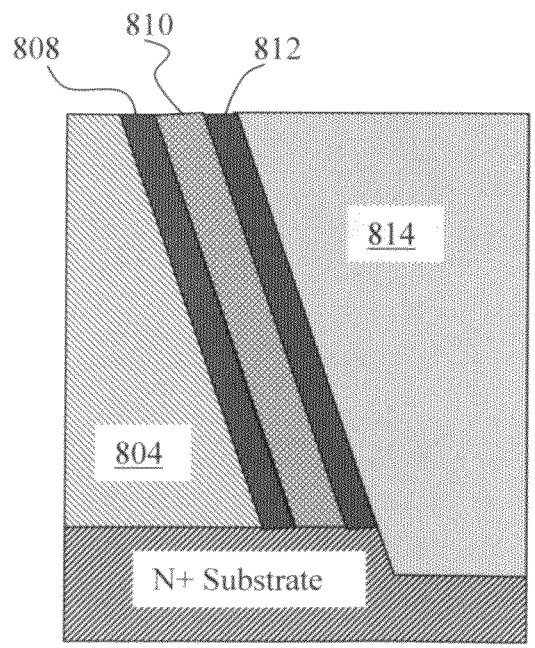
Figure 8E:
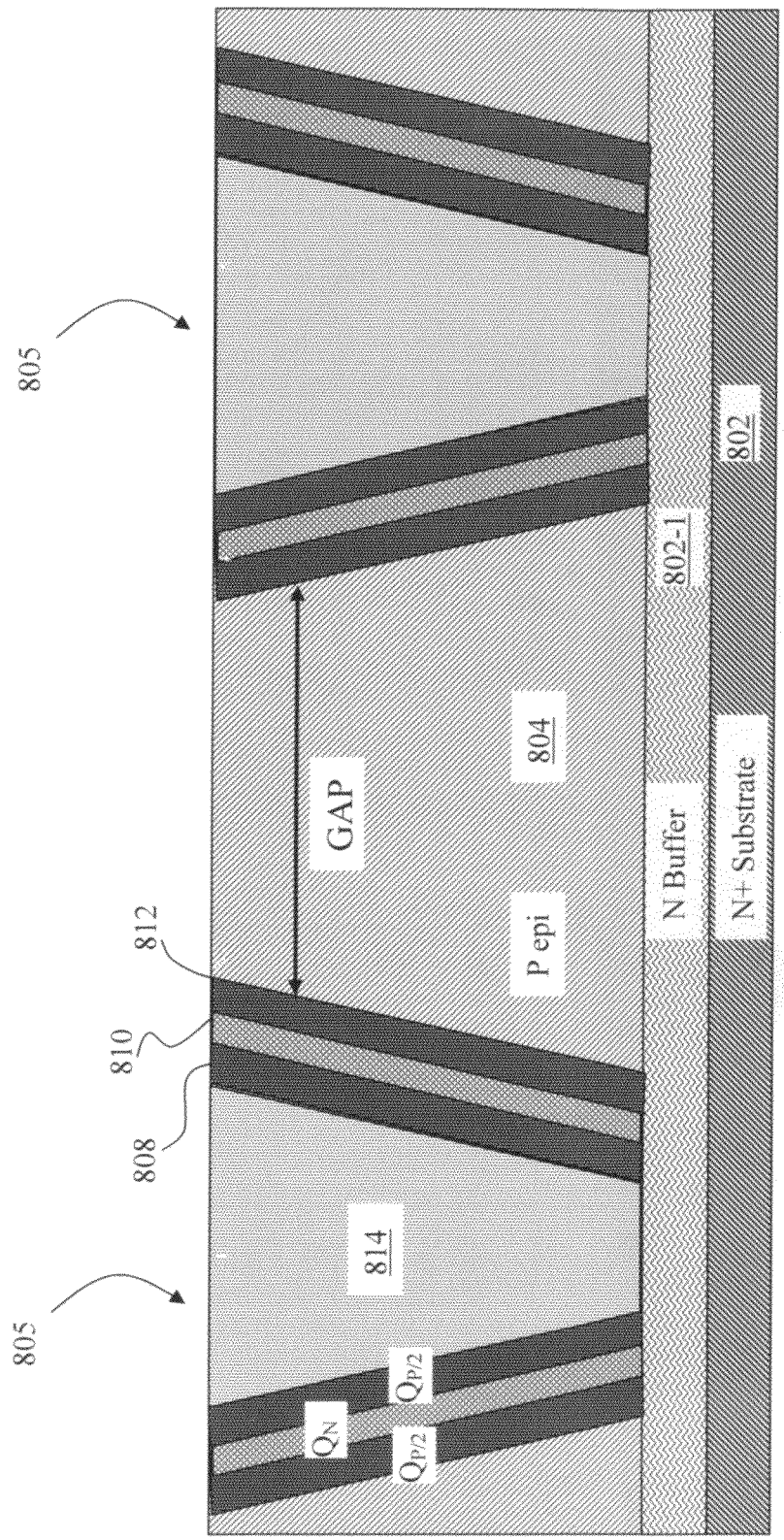

An alternative method for forming a saddle junction edge termination of the type depicted in FIG. 5 is shown in FIGS. 8A-8E. The process is started with a heavily doped N type substrate 802 with a constant or graded P type epitaxial layer 804 at a top portion of the substrate 802. Deep trench etch is performed on the substrate with an etching endpoint recessed below a bottom surface of the P type epitaxial layer to form a deep trench 805, half of which is shown in FIG. 8B. The trench 805 preferably includes slanted sidewalls. N type and P type dopants 806 are alternatively angled implanted at the sidewall of the trench 805 to form alternative P columns 808, 812 and N column 810 as shown in FIG. 8C. An intrinsic or a lightly doped P type or N type material 814 is then filled into the trench 805 as shown in FIG. 8D. As mentioned above, a gap of about 50 microns disposed between trenches 805 will achieve net lightly P doped drift region in the termination area, which results a charge imbalance window of 40% Q and better breakdown voltage, which is shown in FIG. 8E. In this figure, a N buffer layer 802-1 is optionally formed between the substrate 802 and the P-epitaxial layer 804. Further the reach-through prevention P+ doped region 115 as shown in FIG. 5 may be formed in a following step separately or preferably at the same time forming P body regions or P+ contact implant regions of superjunction transistor cells (not shown) in the active area. Ideally the P-columns in active area are electrically connected to the P body regions of active transistor while the P-columns in termination area are floating.

Figure 9A:
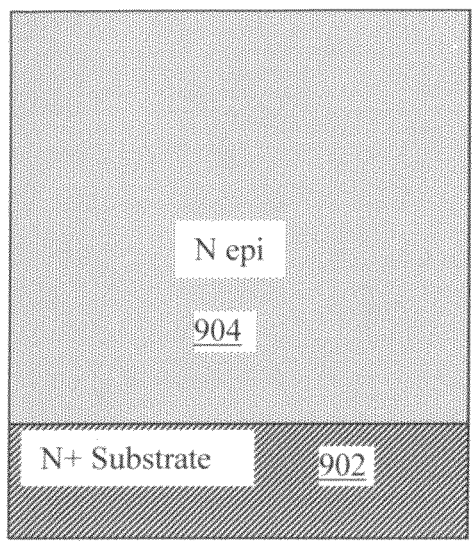
FIGS. 9A-9D are cross sectional views to illustrate an alternative process for manufacturing a super-junction structure of the type depicted in FIG. 3 and FIG. 4.
Figure 9B:
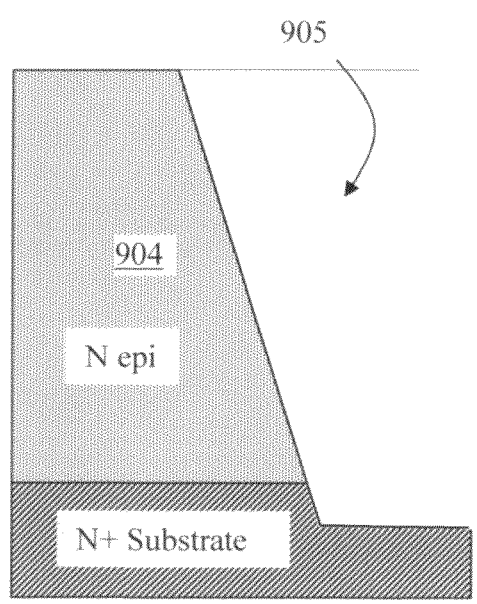
Figure 9C:
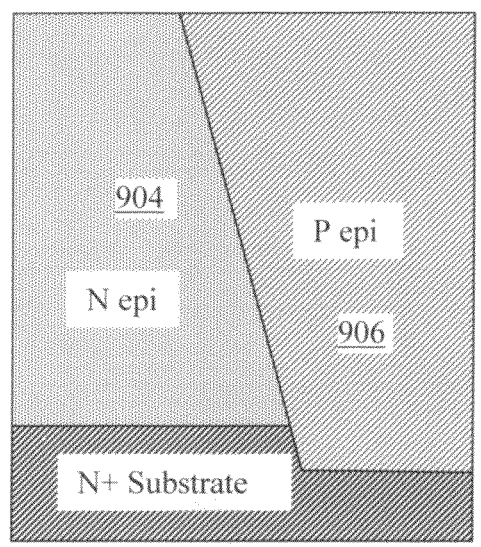
Figure 9D:
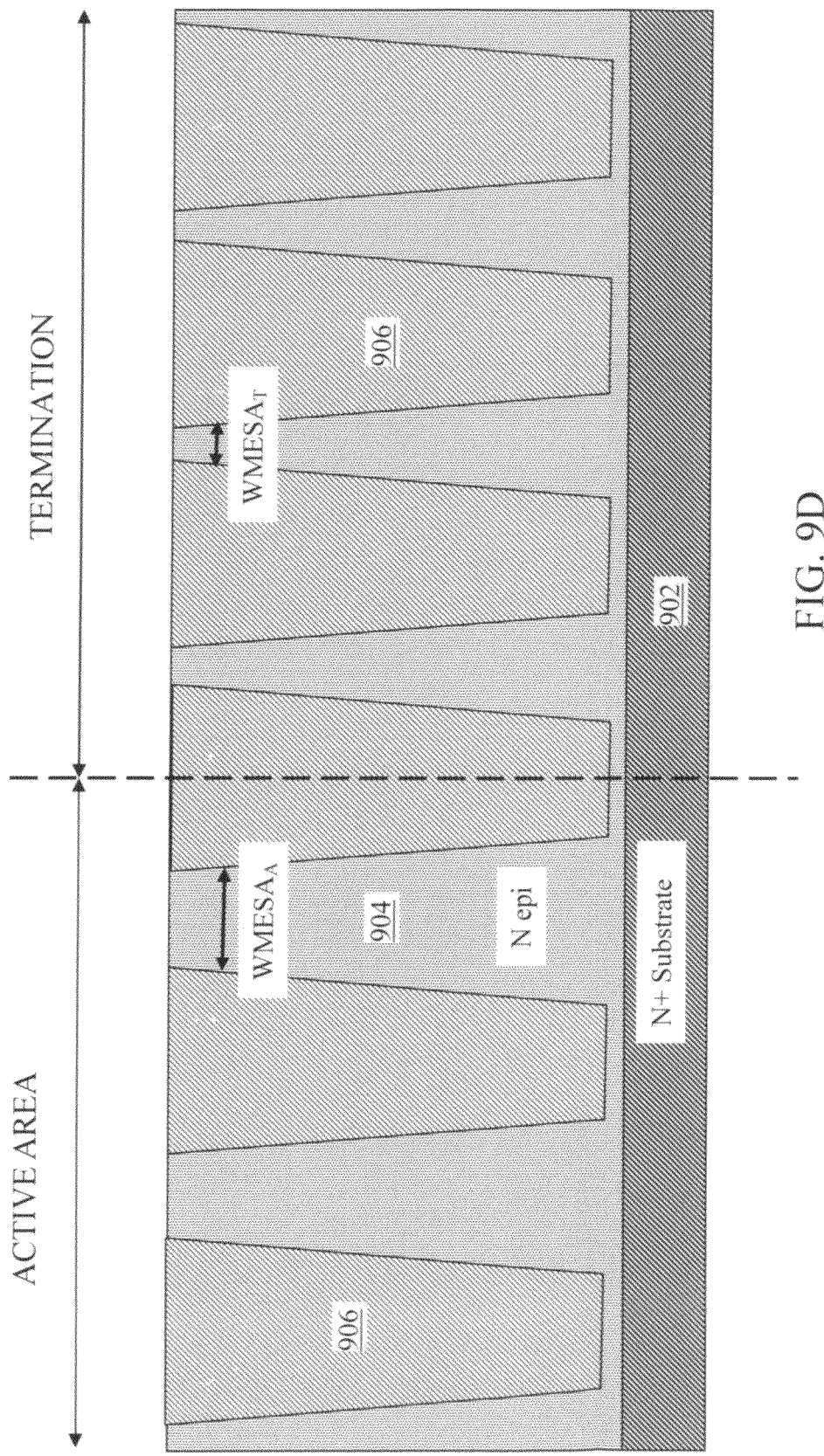

Another alternative method for forming a saddle junction edge termination of the type depicted in FIG. 3 is shown in FIGS. 9A-9D. The process is started with a heavily doped N type substrate 902 with a constant or graded N type epitaxial layer 904 at a top portion of the substrate 902 as shown in FIG. 9A. Deep trench etch is performed on the substrate with an etching endpoint recessed below a bottom surface of the N type epitaxial layer to form a deep trench 905, half of which is shown in FIG. 9B. The trench 905 preferably includes slanted sidewalls. P type epitaxial material 906 is filled in the trench 905 as shown in FIG. 9C. Similar to above method, to achieve P heavy drift region on the termination area, the width of a P-type column must be larger than a width of a N-type column, which can be achieved by reducing mesa width in the termination area. As a result, which is shown in FIG. 9D, the width of a mesa in active area is larger than the width of the mesa in termination area. Further the reach-through prevention P+ doped region 115 as shown in FIG. 3 may be formed in a following step separately or preferably at the same time forming P body regions or P+ contact implant regions of superjunction transistor cells (not shown) in the active area. Ideally the P-columns in active area are electrically connected to the P body regions of active transistor while the P-columns in termination area are floating. P-type and N-type surface junction termination extensions (JTE) 150-P and 150-N shown in FIG. 6 may also be formed through masked implantation.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device disposed in a semiconductor substrate and having an active cell area and an edge termination area wherein:
the edge termination area comprises a superjunction structure having doped semiconductor columns of alternating conductivity types with an electric charge imbalance between the doped semiconductor columns to create a net P type doping in the termination region and to generate a saddle junction electric field in the edge termination; and
the doped semiconductor columns comprise P-columns and N-columns and the super-junction structure is formed in a P-type epitaxial layer having a wide P-gap disposed in a middle of a P-column.

2. The semiconductor power device of claim 1 wherein:
the P-columns having greater electric charges than the N-columns.

3. The semiconductor power device of claim 1 wherein:
the P-columns have greater width than the N-columns.

4. The semiconductor power device of claim 3 wherein:
the P-columns have a width ranging from 2 μm to 10 μm greater than a width of the N-columns ranging from 2 μm to 10 μm.

5. The semiconductor power device of claim 1 wherein:
the P-columns have a higher dopant concentration than the N-columns.

6. The semiconductor power device of claim 1 wherein:
the P-columns have a higher dopant concentration on a top portion than a bottom portion.

7. The semiconductor power device of claim 6 wherein:
the P-columns have a column charge on a top portion ranging from 0 to 50% wherein the column charge on the top portion is higher than a column charge at a bottom portion of the P-columns.

8. The semiconductor power device of claim 1 wherein:
the superjunction structure further includes a surface junction termination extension with a doped surface layer extended laterally on top of and across the semiconductor columns.

9. The semiconductor power device of claim 1 wherein:
the P-columns having greater electric charges ranging from $1e12/cm^2$ to $3e12/cm^2$ than the electric charge of the N-columns ranging from $1e12/cm^2$ to $2e12/cm^2$.

10. The semiconductor power device of claim 1 wherein:
the super-junction structure is formed in the P-type epitaxial layer having a the widen P-gap ranging from 202 μm to 802 μm thus generating a charge imbalance.

11. The semiconductor power device of claim 1 wherein:
the edge termination area has a width ranging from 50 microns to 200 microns and the super-junction structure with the doped semiconductor columns of alternating conductivity types extends over a width ranging from 50 microns to 200 microns in the edge termination.

12. A semiconductor power device disposed in a semiconductor substrate and having an active cell area and an edge termination area wherein:
the edge termination area comprises a superjunction structure having doped semiconductor columns of alternating conductivity types with an electric charge imbalance between the doped semiconductor columns to create a net P type doping in the termination region and to generate a saddle junction electric field in the edge termination; and
the super-junction structure further includes a surface junction termination extension with a doped surface layer extended laterally on top of and across the semiconductor columns to a distance ranging from 202 μm to 802 μm from an outer edge of the active cell area for generating a charge imbalance in the super-junction structure.

13. A method for manufacturing a power device in a semiconductor substrate with an active cell area and an edge termination area comprising:
forming doped semiconductor columns of alternating conductivity types in the edge termination area and forming the doped semiconductor columns with an electric charge imbalance between the doped semiconductor columns to create a net P type doping in the termination region for generating a saddle junction electric field in the edge termination; and the step of forming said doped semiconductor columns further comprises a step of forming P-columns and N-columns by opening a plurality of trenches with slightly slanted sidewalls in an N-type epitaxial layer supported on said semiconductor substrate and opening the trenches with a predefined gap between the trenches followed by implanting ions of alternating conductivities through the sidewalls then filled the trenches with an intrinsically doped material for creating the net P type doping in the termination region.

14. The method of claim 13 wherein:
the step of forming said P-columns and N-columns further comprises a step of forming the P-columns with a greater electric charges than the N-columns.

15. The method of claim 13 wherein:
the step of forming said P-columns and N-columns further comprises a step of forming the P-columns with a greater width than the N-columns.

16. The method of claim 13 wherein:
the step of forming said P-columns and N-columns further comprises a step of forming the P-columns with a greater dopant concentration than the N-columns.

17. The method of claim 13 wherein:
the step of forming said P-columns and N-columns further comprises a step of forming the P-columns with a higher dopant concentration on a top portion than a bottom portion of the P-columns dopant concentration than the N-columns.

18. A method for manufacturing a power device in a semiconductor substrate with an active cell area and an edge termination area comprising:
forming doped semiconductor columns of alternating conductivity types in the edge termination area and forming the doped semiconductor columns with an electric charge imbalance between the doped semiconductor columns to create a net P type doping in the termination region for generating a saddle junction electric field in the edge termination; and wherein the step of forming said doped semiconductor columns further comprises a step of forming P-columns and N-columns by opening a plurality of trenches with slightly slanted sidewalls in an N-type epitaxial layer supported on said semiconductor substrate followed by filling the trenches with an intrinsically P-doped material for creating the net P type doping in the termination region.

* * * * *